United States Patent [19]
Duell

[11] Patent Number: 4,527,762
[45] Date of Patent: Jul. 9, 1985

[54] REAR PANEL AND BRACKET MOUNTING FOR A FAN COIL UNIT

[75] Inventor: Richard J. Duell, Syracuse, N.Y.
[73] Assignee: Carrier Corporation, Syracuse, N.Y.
[21] Appl. No.: 507,606
[22] Filed: Jun. 24, 1983
[51] Int. Cl.³ ............................................. A47G 29/00
[52] U.S. Cl. .............................. 248/222.1; 248/223.1; 248/360
[58] Field of Search ............... 248/73, 500, 220.2, 248/222.1, 222.4, 360, 223.1, 207, 223.4, 224.1, 224.2, 224.4; 312/245

[56] References Cited

U.S. PATENT DOCUMENTS

| | | | |
|---|---|---|---|
| 999,733 | 8/1911 | Ashmore | 248/222.4 |
| 1,007,489 | 10/1911 | Reichel | 248/222.4 |
| 2,126,630 | 8/1938 | Gleitsman | 248/498 |
| 2,696,357 | 12/1954 | Elmer | 248/224 |
| 2,708,088 | 5/1955 | Steinke | 248/223.1 |
| 3,156,282 | 11/1964 | Bedford, Jr. | 248/223.1 |
| 3,710,096 | 1/1973 | McFarlin | 248/207 |
| 4,270,821 | 6/1981 | Verdesca | 312/245 |

FOREIGN PATENT DOCUMENTS

| | | | |
|---|---|---|---|
| 942766 | 4/1956 | Fed. Rep. of Germany | 248/220.2 |
| 374580 | 2/1964 | Switzerland | 248/222.4 |

Primary Examiner—William H. Schultz
Assistant Examiner—Robert A. Olson
Attorney, Agent, or Firm—Robert H. Kelly

[57] ABSTRACT

Apparatus for securing a heat transfer unit to either a wall or a ceiling is disclosed. A fastening panel forming a portion of the heat transfer unit further defines a series of projecting tabs having narrowed tab inclined portions connecting the tabs to the rear panel. Mounting brackets are provided having mounting openings with both wide and narrow portions. The openings are designed such that the tab inclined portion is secured within the mounting opening narrow portion with the tab body abutting a portion of the mounting bracket to maintain the fan coil unit in a secured horizontal position. The bracket might additionally be utilized to secure the unit in a vertical position as when mounting the unit to a wall.

7 Claims, 7 Drawing Figures

REAR PANEL AND BRACKET MOUNTING FOR A FAN COIL UNIT

BACKGROUND OF THE INVENTION

1. Field of the Invention

The present invention relates to means for mounting fan coil units. More specifically, the present invention relates to a combination of tabs formed in the rear panel of a fan coil unit and mounting brackets adapted to be secured to a ceiling or wall for coacting with the tabs of the rear panel to lock the unit in position.

2. Prior Art

Fan coil units are known in the refrigeration and air conditioning fields. A fan coil unit includes a heat exchanger for transferring heat energy between refrigerant flowing through the heat exchanger and air being circulated thereover and a fan for forcing the air to be circulated in heat exchange relation with the heat exchanger.

It is desirable to mount fan coil units in unobtrusive positions. The mounting location of the fan coil may depend upon the particular installation involved. Hence, it is desirable to provide a mounting system which is capable of not only securing the fan coil unit in an upright position on a wall of the enclosure to be conditioned but is likewise suitable for securing the unit in a horizontal position to the ceiling of the enclosure to be conditioned.

The herein described mounting arrangement not only provides for securing a unit to either a wall or the ceiling of an enclosure but additionally provides a safety interlock such that upon installation of the unit to a ceiling the unit is affixed in position prior to being secured with screws thereby helping to prevent an inadvertent catastrophic plunge of the unit to the floor.

The herein described apparatus makes use of the back panel of the fan coil unit for providing tabs which may interlock with mounting brackets. Additionally, a series of tabs are provided spaced in rows such that a single bracket may coact with numerous tabs for securing the unit in position.

SUMMARY OF THE INVENTION

It is an object of the present invention to provide means for mounting a fan coil unit to a planar surface.

It is a further object of the present invention to provide an assembly capable of securing a fan coil unit to either a vertical wall or a horizontal ceiling.

It is another object of the present invention to provide interlocking bracket/tab arrangement for maintaining a fan coil unit safely in position against the ceiling prior to insertion of screws to lock the unit in position.

It is a further object of the present invention to provide a fan coil unit wherein a portion of the back panel has been deformed to constitute tabs for securing the unit in position.

It is a still further object of the present invention to provide a safe, economical and reliable apparatus and method for securing a fan coil unit in position.

Other objects will be apparent from the description to follow and the appended claims.

The above objects are achieved according to the preferred embodiment of the invention by the combination of an assembly for mounting a heat transfer unit to either a wall or ceiling of a space to be conditioned. A fastening panel forming a portion of the heat transfer unit defines at least one tab having a tab inclined portion of relatively narrow width angled from the panel. A tab body is connected to the tab inclined portion and has a relatively greater width, said tab body being generally in a plane parallel to the plane defined by the fastening panel. At least one mounting bracket including means for securing the bracket to either the wall or the ceiling of the space to be conditioned is provided. The mounting bracket includes a base portion secured to a wall or ceiling, a connecting portion extending from and angled to the base portion, said connecting portion defining a mounting opening including a narrow portion and a wide portion and a retainer portion extending from the connecting portion. Said mounting opening is sized to allow the tab body to pass through the wide portion of the opening and the inclined portion to fit through the narrow portion of the opening whereby upon assembly of the fastening panel to the mounting bracket the fastening panel is secured relative to the mounting bracket with the inclined portion of the tab located in the narrow portion of the fastening opening and the tab body engaging the retainer portion to secure the unit in position relative to the mounting bracket. A fastener may thereafter be inserted through openings in the tab body and retainer portion to secure the fan coil unit to the wall or ceiling and to the mounting bracket.

DESCRIPTION OF THE PREFERRED EMBODIMENT

The embodiment as described herein is adapted for use in securing a fan coil unit to either a ceiling or wall. It is to be understood that this invention has like applicability to securing other types of structures having flat panels to various support members. It is additionally to be understood that although the invention is described particularly with reference to a single tab and a single mounting bracket that multiple tabs and mounting brackets may be used for a single unit. Additionally, the herein described fan coil unit is designed to be mounted on the wall spaced from the floor such that air may enter the bottom of the unit. Other designs allowing for air flow to enter through the front or sides of the unit are likewise suitable for utilizing the disclosed mounting arrangement.

Figure 1:
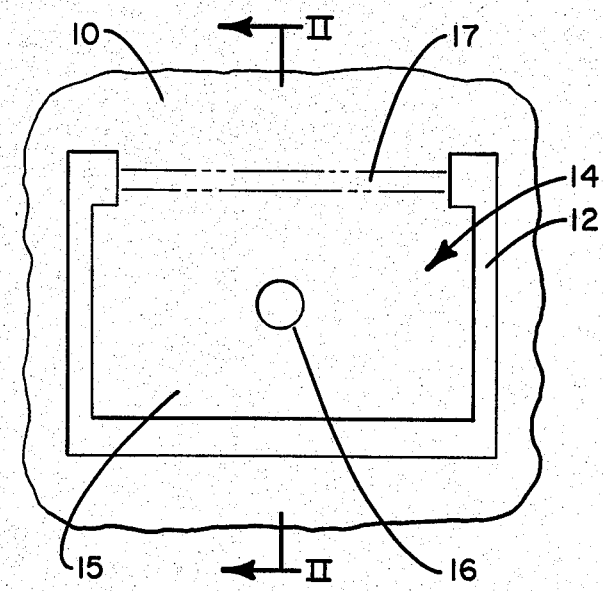
FIG. 1 is a partial cutaway view of the rear panel of an air conditioning unit showing a single tab.

Referring now to FIG. 1, there can be seen a partially cutaway top view of the rear panel showing a tab. Rear panel 10 is a planar surface and has tab 14 formed therefrom. Tab 14 is defined from rear panel 10 via slot 12 caused by stamping a portion of the metallic rear panel.

Figure 2:
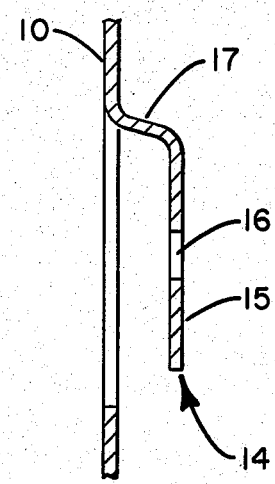
FIG. 2 is a sectional view taken along line II—II of FIG. 1 showing the fastening panel and tab.

Tab 14 includes tab body 15 generally parallel to rear panel 10 and tab inclined portion 17 extending from and connecting rear panel 10 to tab body 15. It can additionally be seen that the width of the tab inclined portion 17 is less than the width of tab body 15. Tab body 15 additionally defines tab opening 16 through which a fastener may be inserted. FIG. 2 is a cross-sectional view of FIG. 1 taken along line II—II. Therein it may be seen that rear panel 10 forms a planar surface and that tab 14 is displaced from and generally parallel to rear panel 10. Opening 16 is shown in the center of tab body 15 for the receipt of the fastener. Tab inclined portion 17 is shown connecting the rear panel 10 to tab body 15.

Figure 3:
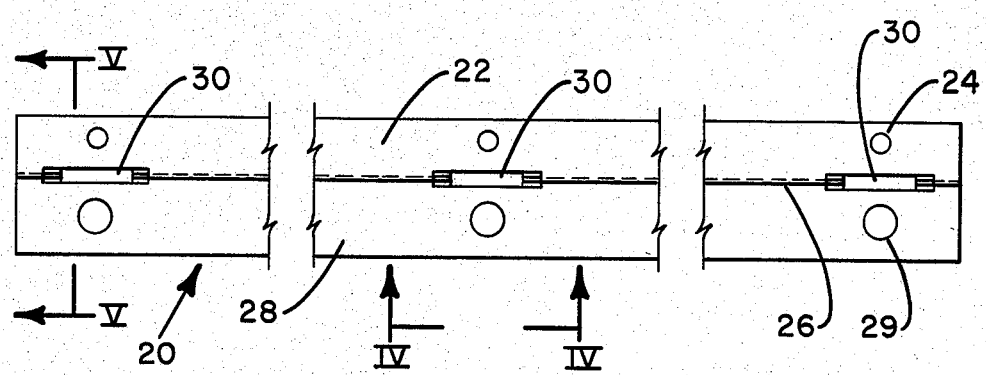
FIG. 3 is a partially cutaway top view of a mounting bracket.
Figure 4:
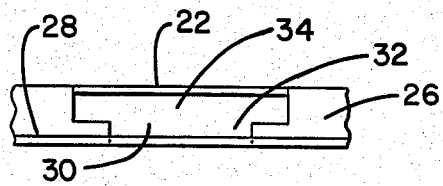
FIG. 4 is a partial side sectional view of the mounting bracket taken along lines IV—IV of FIG. 3.
Figure 5:
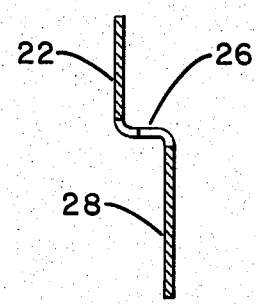
FIG. 5 is a sectional view of the mounting bracket taken along lines V—V of FIG. 3.

FIGS. 3, 4 and 5 all show the mounting bracket. In FIG. 3 it may be seen that mounting bracket 20 defines three mounting openings 30 spaced from each other along the bracket. The bracket further includes mounting bracket base 22 defining mounting holes 24 such that the mounting bracket is secured to the wall or ceiling through mounting holes 24 with the mounting bracket base engaging the wall or ceiling. Extending from mounting bracket base 22 is connecting portion 26. Portion 26 is generally shown as being perpendicular to mounting base 22 and defines mounting opening 30. Mounting opening 30 has a wide portion 34 and a narrow portion 32 together defining a generally T-shaped slot. Connected to the other end of connection portion 26 from mounting bracket base 22 is retainer portion 28. Retainer portion 28 defines fastener opening 29 through which the fastener may be inserted. As may be seen in FIG. 5, mounting bracket base 22 and retainer portion 28 are generally parallel to each other although displaced the distance of connecting portion 26.

Figure 6:
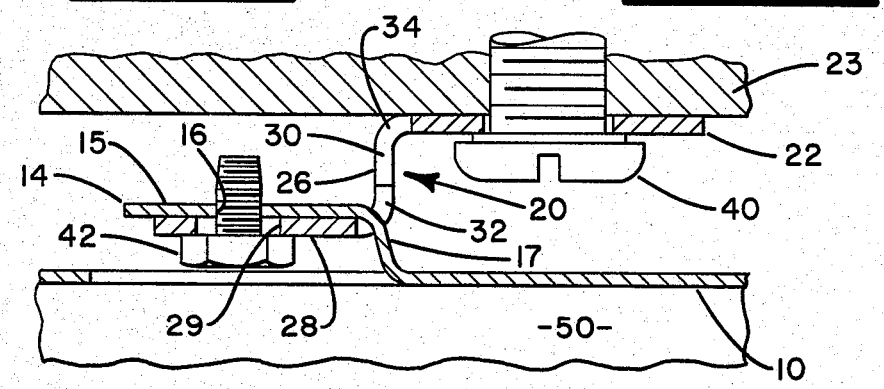
FIG. 6 is a sectional view of a rear panel and mounting bracket mounted together in the horizontal or ceiling position.

FIG. 6 shows a ceiling mounting arrangement utilizing the rear panel and mounting bracket as disclosed. The mounting bracket 20 is shown having mounting bracket base 22 parallel with and contacting ceiling 23. Fastener 40 acts to secure the mounting bracket via the mounting bracket base 22 to ceiling 23. Mounting bracket 20 additionally includes connecting portion 26 extending generally perpendicular from the mounting bracket base 22 and defining the mounting opening having wide portion 34 and narrow portion 32. Retainer portion 28 is shown extending generally parallel to mounting bracket base 22 and engaging tab body 15 of tab 14. It can be seen that fan coil unit 50 includes a rear panel 10 having tab inclined portion 17 extending outwardly therefrom. Connected to tab inclined portion 17 is tab body 15 which rests on retainer portion 28 of the mounting bracket. It may be seen that tab inclined portion 17 is relatively narrow in width and fits within the narrow portion 32 of mounting opening 30. Fastener 42 is shown extending through fastener opening 29 and fastener opening 16 to secure the mounting bracket and rear panel to each other. Fastener 42 may additionally extend into the ceiling to secure both the mounting bracket and the rear panel to the ceiling to secure the unit in position.

To assembly unit 50 to the mounting bracket, the mounting bracket is first secured to the ceiling via fastener 40. The unit is then positioned and tab 14 including tab body 15 is slid through the wide portion 34 of mounting opening 30.

Once the tab body is entirely through the wide portion, the rear panel may be vertically lowered with the tab inclined portion of relatively narrow width now fitting within narrow portion 32 such that the tab body rests on the retainer portion of the mounting bracket to secure the unit in position. The fastener 42 is then inserted to maintain the unit as desired.

Since tab body 15 is wider than the narrow portion of the slot the unit cannot be removed from the mounting brackets once the tab body is inserted completely through the wide portion of the opening and lowered into position since the tab body portion is wider than the narrow portion of the mounting slot. Hence, to remove the unit the unit must be vertically displaced upwardly until the tab body is in registration with the wide portion of the slot. The installer may insert the unit with the tab sliding through the wide portion of the slot and then lower the unit to its final position. The unit is now safely engaged in position until the screws are inserted to further secure the unit in position. By this tab/slot arrangement the unit may not be inadvertently dislodged causing it to plunge to the floor.

Figure 7:
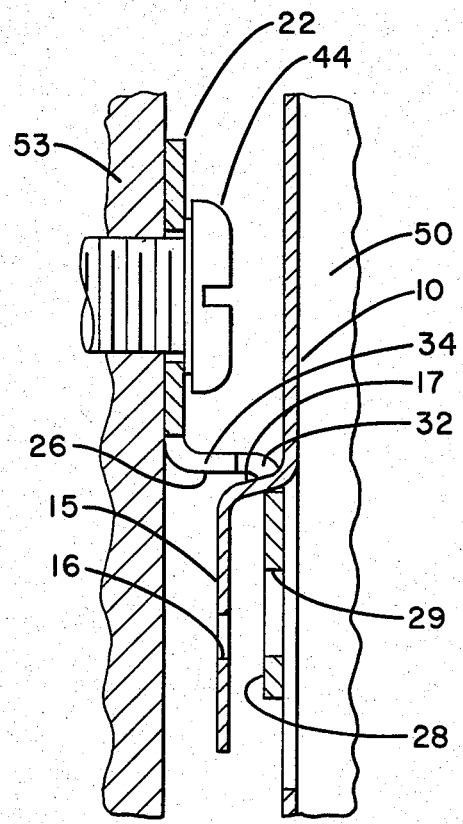
FIG. 7 is a sectional view of the mounting bracket and rear panel engaged together in the vertical or wall mounting position.

Referring now to FIG. 7, the identical engagement of the mounting bracket to the rear panel is disclosed for a vertical or wall type arrangement. In this arrangement, the mounting bracket is secured via fastener 44 through the mounting bracket base 22 to be secured to wall 53. Rear panel 10 of unit 50 has tab body 15 connected via tab inclined portion 17 mounted parallel with the retainer portion 28 of the mounting bracket. Since the mounting bracket and the unit are now in a vertical position, gravity is exerting a downward force on the unit forcing the tab downwardly into engagement with the mounting slot. Again, the tab is inserted with the tab body entering through the wide portion 34 of the mounting slot and is secured with the tab inclined portion within narrow portion 32 of the mounting slot. Openings 16 and 29 for the receipt of a fastener are further disclosed.

It is contemplated that a fan coil unit might have six tabs arranged in two rows of three tabs each. A mounting bracket may suitably have three openings, one sized to receive each tab. Hence, two mounting brackets could be utilized with a single panel having six tabs to secure three tabs in each mounting bracket to maintain the unit in position. A fastener is driven, such as fastener 42, to secure the unit to the mounting bracket from within the interior of the unit.

The invention has been described herein with reference to a particular embodiment. It is to be understood by those skilled in the art that variations and modifications can be effected within the spirit and the scope of the claims.

What is claimed is:

1. An assembly for mounting a heat transfer unit to either a wall or a ceiling of a space to be conditioned which comprises:

a planar fastening panel forming a portion of the heat transfer unit, said panel having at least one slot defining at least one integral tab having a tab inclined portion angled from the panel and having a relatively narrow width and a tab body connected to the tab inclined portion and having a relatively greater width, said tab body being generally in a plane spaced from and adjacent said slot and parallel with a plane defined by the fastening panel; and at least one mounting bracket including means for securing the bracket to either a wall or the ceiling of the space to be conditioned, said mounting bracket including a base portion secured to the wall or ceiling, a connecting portion extending from and angled to the base portion, said connecting portion defining a mounting opening including a narrow portion and a wide portion and a retainer portion extending from the connecting portion in a direction parallel to and away from the base portion, said narrow portion being nearest said retainer portion and said wide portion being nearest said base portion and said mounting opening being sized to allow the tab body to pass through the wide portion of the opening and the inclined portion to fit through the narrow portion of the opening when said tab body and said retainer portion extend in the same direction whereby upon assembly of the fastening panel to the mounting bracket the fastening panel is secured relative to the mounting bracket with the inclined portion of the tab located in the narrow portion of the mounting opening and the tab body adjacent the retainer portion, and wherein said tab body defines a tab opening, and the retainer portion of the mounting bracket defines a fastener opening, and further comprising a fastener extending through the fastener opening in the mounting bracket and tab opening to secure the fastening panel to the mounting bracket.

2. The apparatus as set forth in claim 1 wherein the fastening panel comprises a series of spaced tabs and wherein the mounting bracket defines a plurality of mounting openings corresponding one to each of the spaced tabs.

3. The apparatus as set forth in claim 2 wherein the fastening panel is the rear panel of the heat transfer unit and the mounting bracket further comprises multiple mounting brackets, one for each series of spaced tabs.

4. The apparatus as set forth in claim 1 wherein when the mounting bracket is mounted in a horizontal position the narrow portion of the mounting opening is located vertically below the wide portion of the mounting opening and wherein the tab after insertion through the wide portion of the mounting opening drops downwardly engaging the retainer portion of the mounting bracket with the tab inclined portion located in the narrow portion of the mounting opening whereby after insertion of the tab through the mounting opening the tab may only be removed by displacing the heat transfer unit vertically upward.

5. The apparatus as set forth in claim 1 wherein the mounting bracket and fastening panel may be engaged either when mounted horizontally or vertically.

6. A fan coil unit including a housing for use with an air conditioning system which may be mounted to either the ceiling or a wall of a space to be conditioned which comprises:
a planar fastening panel defining a portion of the housing of the fan coil unit, said panel including a plurality of slots defining tabs spaced from and parallel to said panel, each tab having a tab inclined portion of a relatively narrow width connecting the tab to said panel, said tab having a relatively greater width than the tab inclined portion and being located adjacent the slot defining the tab; and
at least one mounting bracket which may be fastened to the wall or ceiling to which the fan coil unit is to be mounted, said mounting bracket including a base portion secured to the wall or ceiling, a connecting portion extending from and angled to the base portion and a retainer portion extending from said connecting portion parallel to and spaced away from said base portion, said connecting portion defining mounting slots, each having a narrow portion wider than a tab inclined portion but narrower than a tab and a wider portion wider than a tab, whereby when said tabs and said base portion are parallel and extend in the same direction, the fastening panel may be secured to the mounting bracket by insertion of the tabs through the wide portions of the mounting slots and positioning the tabs to be adjacent and supported by the retainer portion with the tab inclined portions extending within the narrow portions of the mounting slots, and wherein each said tab defines a tab opening, and said retainer portion of the mounting bracket defines fastener openings, and further comprising fasteners extending through the fastener openings in the mounting bracket and tab openings to secure the fastening panel to the mounting bracket.

7. The apparatus as set forth in claim 6 wherein the fastening panel defines a plurality of tabs arranged in rows and further comprising multiple mounting brackets one for each row of tabs, said mounting brackets each defining one mounting slot corresponding to each tab in the row of tabs extending from the fastening panel.

* * * * *